United States Patent [19]

Ikari

[11] Patent Number: 4,731,753
[45] Date of Patent: Mar. 15, 1988

[54] PACKAGE FOR SEMICONDUCTOR DEVICE

[75] Inventor: Hiroji Ikari, Kokubu, Japan

[73] Assignee: Kyocera Corporation, Kyoto, Japan

[21] Appl. No.: 623,158

[22] Filed: Jun. 21, 1984

[30] Foreign Application Priority Data

Jun. 24, 1983 [JP] Japan .............................. 58-114854

[51] Int. Cl.$^4$ ............................................. G11C 13/00
[52] U.S. Cl. ...................................... 365/52; 365/244
[58] Field of Search ................................. 365/52, 244

[56] References Cited

U.S. PATENT DOCUMENTS

| | | | | |
|---|---|---|---|---|
| 3,924,246 | 12/1975 | Scherer | ................ | 365/106 |
| 4,502,130 | 2/1985 | Kuckuk | ................ | 365/52 |
| 4,519,050 | 5/1985 | Folmsbee | ................ | 365/53 |
| 4,530,074 | 7/1985 | Folmsbee | ................ | 365/53 |

Primary Examiner—Terrell W. Fears
Attorney, Agent, or Firm—Spensley Horn Jubas & Lubitz

[57] ABSTRACT

A package suitable to contain therein a semiconductor memory element erasable of the stored information by irradiation with ultraviolet rays on the element with no fear of weak ultraviolet rays such as contained in natural light undesirably acting on the semiconductor memory device to erase the information.

In the package, a lid for closing a cavity over an insulating base, the insulating base having mounted thereon the semiconductor element, has an ultraviolet transmission glass provided at a portion thereof opposite to the semiconductor device, and the glass has at least one surface formed into a rough surface having a transmittance of ultraviolet rays of 80% or less.

Thus, the ultraviolet transmission glass is lower in transmittance due to the rough surface and The transmission of the weak ultraviolet rays is intercepted by the rough surface, whereby the information stored in the semiconductor memory element is not undesirably erased by the weak ultraviolet rays.

8 Claims, 2 Drawing Figures

PACKAGE FOR SEMICONDUCTOR DEVICE

This invention relates to a package for containing therein a semiconductor element, and more particularly to an improved package for containing therein the erasable and programmable read only memory element.

Recently, the read only memory element for use in the information processor, in accordance with its high performance, has changed to the erasable and programmable one which is desirably changeable of the stored information, in other words, erasable of the same by ultraviolet irradiation, and also able to be newly written upon with the desired information.

Figure 1:
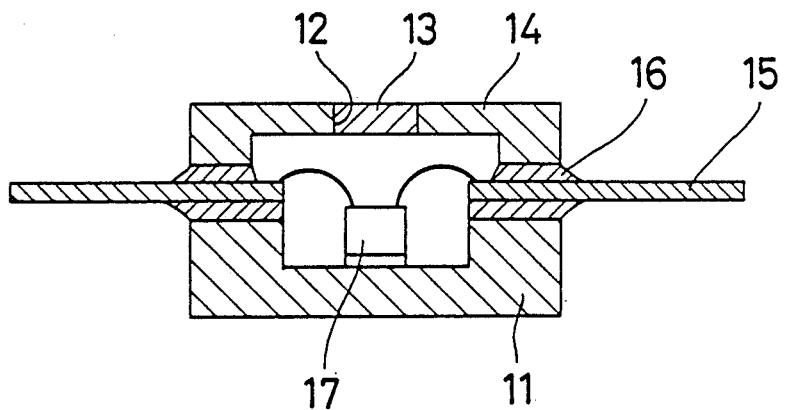

Conventionally, the semiconductor package for containing therein the erasable and programmable read only memory element (hereinafter called EP-ROM), as shown in FIG. 1, comprises; an insulating base member 11 composed of an electrical insulating material, such as ceramics or plastics; a lid 14 which is composed of an electrical insulating material and provided at aperture 12 opposite to an EP-ROM 17 mounted on the base member 11 with a glass 13 capable of transmitting ultraviolet rays to erase the stored information in EP-ROM 17; and leads 15 for electrically connecting EP-ROM 17 to the external circuit.

After EP-ROM 17 is mounted on the base member 11 and the electrodes of EP-ROM 17 are connected to leads 15 by means of wire-bonding, the EP-ROM 17 is airtight-sealed by adhering the lid 14 on the base member 11 with sealing material 16, such as glass or resin, thereby completing a semiconductor memory device.

The conventional package, however, is provided at the aperture of the lid 14 with ultraviolet transmission glass 13 which is transparent and finished on both horizontal surfaces to smoothness, thereby having extremely good transmittance of 85% or more. Hence, the weak ultraviolet rays existing in the exterior, for example, the rays contained in natural light, are easily transmitted into the semiconductor device. As a result, the package has the defect that the information stored in EP-ROM 17 will be erased undesirably.

An object of the invention is to provide a package for a semiconductor device which effectively interrupts transmission of weak ultraviolet rays to completely eliminate undesired erase operations other than erase operation for the information stored in EP-ROM.

The above and other objects and features of the invention will appear more fully hereinafter from a consideration of the following description taken in connection with the accompanying drawing wherein one example is illustrated by way of example.

Figure 2:
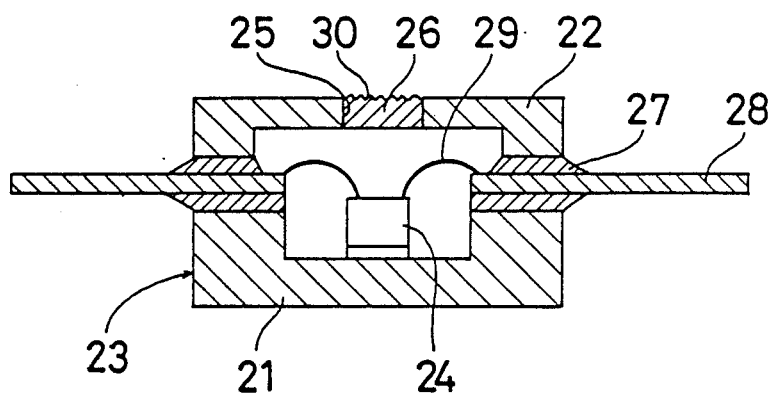
Figure 1:
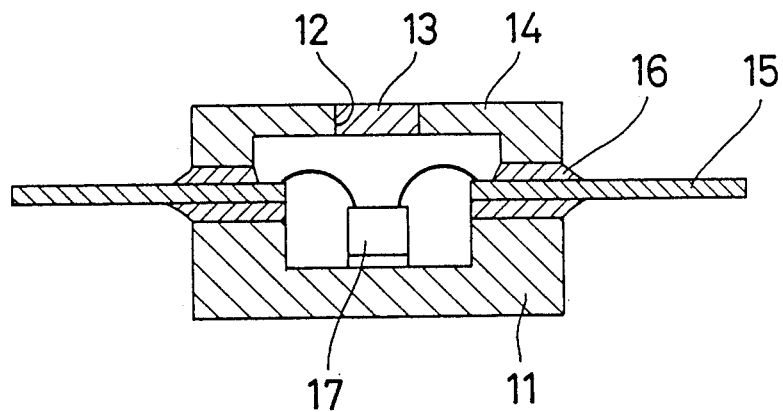
Figure 2:
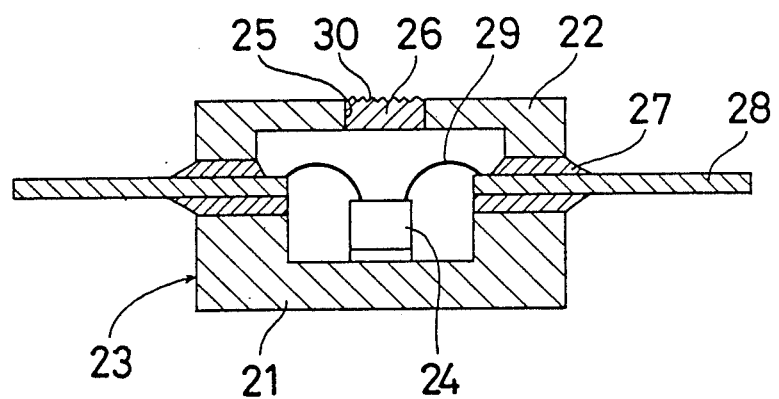
Figure 1:
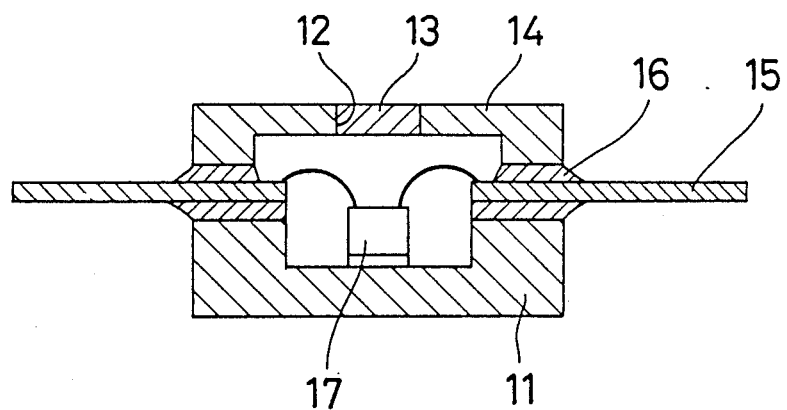
Figure 2:
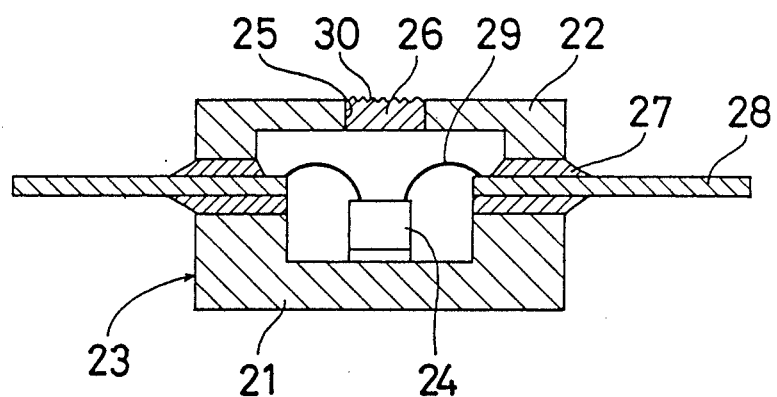

FIG. 1 is a sectional view of a semiconductor memory device using a conventional package, and FIG. 2 is a sectional view of a semiconductor memory device using a package of the invention.

Referring to FIG. 2, reference numeral 21 designates an insulating base member composed of an electrical insulating material, such as ceramics or plastics, and 22 designates a lid composed of an electrical insulating material the same as the above.

The base member 21 and lid 22 are provided at the central portions with cavities to contain a semiconductor memory element therein. At the bottom of the cavity of the base member 21, an erasable and programmable read only memory element (EP-ROM) 24 is bonded by an adhesive, such as resin, glass or solder.

The lid 22 has ultraviolet transmission glass 26 mounted to an aperture 25, which is provided at a portion of lid 22 opposite to the EP-ROM 24.

Concretely, the ultraviolet transmission glass 26 is molten at the surroundings thereof and fixed to the edges of the aperture 25 of the lid 22, thereby being mounted thereto. The glass 26, the same as the conventional, functions to transmit therethrough the ultraviolet rays to erase the stored information of the EP-ROM 24 from the outside of a package 23.

The base member 21 and lid 22 are adhered by sealing material, such as glass or resin, whereby the EP-ROM 24 is sealed in an airtight manner completely from outside air.

Also, between the base member 21 and the lid 22 are disposed leads 28 formed of conductive material, such as aluminum (Al), copper (Cu) or Kovar (Fe-Ni-Co), the leads 28 each being electrically connected to an electrode of the EP-ROM 24 by means of a wire 29, and to an external circuit to thereby connect the EP-ROM 24 thereto.

In addition, the leads 28 are bonded between the base member 21 and the lid 22 simultaneously with airtight-sealing of the package 23 by the sealing material 27.

According to this package, the EP-ROM 24 is mounted on the bottom of the cavity in the base member 21, each electrode of EP-ROM 24 is connected to each lead 28 by means of the wire 29, and thereafter the base member 21 and lid 22 are adhered to each other by use of sealing material 27, thereby sealing the EP-ROM 24 in the package in an airtight manner, thus forming the semiconductor memory device.

To be noted, it is important for the present invention to make rough at least one of both horizontal surfaces of ultraviolet transmission glass 26 provided at the lid 22 to thereby have a transmittance of ultraviolet rays of 80% or less.

To perform this, in the embodiment as shown in FIG. 2, the upper surface of ultraviolet transmission glass 26 is formed in a rough surface 30 of jags of 0.5 to 3 $\mu$m in size.

Thus, the upper surface of ultraviolet transmission glass 26 is made rough, so that the transparency thereof largely lowers, and at the same time the transmission efficiency of ultraviolet ray lowers because the incident ultraviolet ray causes irregular reflection on the rough surface. Hence, even if such weak ultraviolet ray as contained in the natural light is irradiated onto the ultraviolet transmission glass 26, the ultraviolet transmission is intercepted by the rough surface of glass 26, thereby completely removing undesired erase of the information stored in the EP-ROM 24.

Alternatively, the rough surface 30 formed on the ultraviolet transmission glass 26 may be formed on the lower surface only, or on both horizontal surfaces. In this case, it is easily understood by those skilled in the art that the same effect as in the case of the formation of the rough surface on the upper surface only is obtained.

Various methods are proposed for forming the rough surface 30 on the ultraviolet transmission glass 26, in which it is preferable in this invention to heat and melt the ultraviolet transmission glass 26 and then abut a tool having a jagged face against the molten glass, thereby forming the rough surface 30. Such method completely prevents the occurrence of internal stress and cracks in the glass due to the formation of the rough surface as described above, whereby even if the ultraviolet transmission glass is subjected to the external stress, there is no fear of breaking the ultraviolet transmission glass.

As seen from the above, the semiconductor device package of the invention, which makes rough at least one surface of ultraviolet transmission glass, can effectively prevent transmission of weak ultraviolet rays, so that undesired erasure of the information stored in the erasable and programmable read only memory element is completely eliminated, thereby being extremely useful.

While an embodiment of the invention has been shown and described the invention is not limited to the specific construction thereof, which is merely exemplary in the specification rather than defined.

What is claimed is:

1. A package for a semiconductor device comprising an insulating base member and a lid to contain the semiconductor element therein, said lid being provided at a portion thereof opposite to at least a portion of said semiconductor element with ultraviolet transmission glass, at least one surface of which is rough, having jags of 0.5 to 3 $\mu$m in size.

2. A package for a semiconductor device according to claim 1, wherein said ultraviolet transmission glass has a transmittance of ultraviolet rays of 80% or less.

3. A package for a semiconductor device according to claim 1, wherein at least one surface of said ultraviolet transmission glass is made rough by allowing a tool having a jagged face abut against said glass while in a molten state.

4. A package for a semiconductor device according to claim 1, wherein said semiconductor element contained in said package is an erasable and programmable read only memory element.

5. In a package for a semiconductor device comprising an insulating base member and a lid having an ultraviolet transmitting glass portion, said package for containing an erasable and programmable read only memory erasable by ultraviolet light transmitted through said glass portion, the improvement comprising said glass portion having at least one surface roughened to the extent that ultraviolet light in natural light is not effectively transmitted by said glass portion to erase said memory while ultraviolet light intended to erase said memory is effectively transmitted wherein said at least one surface of said ultraviolet transmitting glass which is roughened has jags of 0.5 to 3 $\mu$m in size.

6. The improvement of claim 5 wherein said ultraviolet transmitting glass has a transmittance of ultraviolet rays of 80% or less.

7. The improvement of claim 5 wherein said at least one surface is roughened by abutting a tool having a jagged face against said glass while said glass is in a molten state.

8. The improvement of claim 5 wherein said at least one surface of said ultraviolet transmitting glass which is roughened has jags on the order of about 0.5 $\mu$m or greater.

* * * * *